United States Patent

Krause et al.

[11] Patent Number: 5,959,911
[45] Date of Patent: Sep. 28, 1999

[54] APPARATUS AND METHOD FOR IMPLEMENTING A BANK INTERLOCK SCHEME AND RELATED TEST MODE FOR MULTIBANK MEMORY DEVICES

[75] Inventors: Gunnar H. Krause, Burlington; Oliver Kiehl, Charlotte, both of Vt.

[73] Assignee: Siemens Aktiengesellschaft, Munich, Germany

[21] Appl. No.: 08/939,546

[22] Filed: Sep. 29, 1997

[51] Int. Cl.$^6$ .................................................. G11C 7/00
[52] U.S. Cl. ............... 365/201; 365/230.03; 365/185.09; 365/189.04
[58] Field of Search ................ 365/201, 230.03, 365/185.09, 189.04

[56] References Cited

U.S. PATENT DOCUMENTS

| | | | |
|---|---|---|---|
| 4,752,929 | 6/1988 | Kantz et al. | 371/21 |
| 4,782,486 | 11/1988 | Lipcon et al. | 371/21 |
| 4,860,259 | 8/1989 | Tobita | 365/201 |
| 4,885,748 | 12/1989 | Hoffmann et al. | 371/21.3 |
| 5,148,398 | 9/1992 | Kohno | 365/201 |
| 5,231,605 | 7/1993 | Lee | 365/201 |
| 5,671,392 | 9/1997 | Parris et al. | 395/475 |
| 5,706,234 | 1/1998 | Pilch, Jr. et al. | 365/201 |

Primary Examiner—David Nelms
Assistant Examiner—Tuan T. Nguyen
Attorney, Agent, or Firm—Donald B. Paschburg

[57] ABSTRACT

Testing of a multibank memory device having a plurality of memory banks which includes activating two or more of the plurality of memory banks for participation in the test; selecting at least one common memory address corresponding to a memory cell within each activated bank; simultaneously writing test data into the selected memory cell of each activated bank; simultaneously reading the test data previously written into the selected memory cell of each activated bank; and comparing the test data read from each activated bank with the test data from each other activated bank and if a match is determined to exist, then indicating a pass condition, else indicating a fail condition.

15 Claims, 2 Drawing Sheets

FIG. 2

| C\R | 1 | 2 | 3 | 4 | 5 | 6 | 7 | 8 | 9 | 10 | 11 | 12 | 13 |
|---|---|---|---|---|---|---|---|---|---|---|---|---|---|
| | TMC | BS | | | | BA | | | | MX | | | |
| | | MSB | ... | | LSB | 0 | 1 | ... | N | 0 | 1 | ... | N |
| 1 | 0 | 0 | 0 | 0 | 0 | 1 | X | X | X | 1 | 0 | 0 | 0 |
| 2 | 0 | 0 | 0 | 0 | 0 | 0 | X | X | X | 0 | 0 | 0 | 0 |
| 3 | 0 | 0 | 0 | 0 | 1 | X | 1 | X | X | 0 | 1 | 0 | 0 |
| 4 | 0 | 0 | 0 | 0 | 1 | X | 0 | X | X | 0 | 0 | 0 | 0 |
| 5 | 0 | 1 | 1 | 1 | 1 | X | X | X | 1 | 0 | 0 | 0 | 1 |
| 6 | 0 | 1 | 1 | 1 | 1 | X | X | X | 0 | 0 | 0 | 0 | 0 |
| 7 | 1 | X | X | X | X | BA0 | BA1 | ... | BAN | BA0 | BA1 | ... | BAN |

FIG. 3

| C\R | 1 | 2 | 3 | 4 | 5 | 6 | 7 | 8 | 9 |
|---|---|---|---|---|---|---|---|---|---|
| 1 | SRDLT | 0 | 1 | 1 | 0 | 0 | 1 | 1 | 0 | X |
| 2 | SRDLC | 1 | 0 | 1 | 0 | 1 | 0 | 1 | 0 | X |
| 3 | TMC | 0 | 0 | 0 | 0 | 1 | 1 | 1 | 1 | X |
| 4 | OE | 1 | 1 | 1 | 1 | 1 | 1 | 1 | 1 | 0 |
| 5 | DQ | 0 | 1 | HiZ | INVALID OR NOT POSSIBLE | 0 PASS | 0 PASS | HiZ | 1 FAIL | HiZ |

APPARATUS AND METHOD FOR IMPLEMENTING A BANK INTERLOCK SCHEME AND RELATED TEST MODE FOR MULTIBANK MEMORY DEVICES

BACKGROUND OF THE INVENTION

1. Field of the Invention

The present invention relates to multibank memory devices and, more particularly, relates to an improved bank interlock scheme and test mode for multibank memory devices.

2. Description of the Prior Art

It is known that the entire memory array in a multibank memory device is divided into functionally identical memory banks. Each bank typically has the same number of word lines and bit lines which may be activated independent of each other bank. As a result, the row address used to activate one bank need not be the same as any other row address used to activate any other bank.

It is also known that activation of a word line via a row address results in all memory cells associated with the activated word line being latched in the respective sense amplifiers for each corresponding bit line. In conventional standard operating mode, each read or write command provides bank select information and a column address in order to choose or select a particular bit line of the activated word line of a bank. That is, first the bank select information is used to select one bank and only in that bank the column address is used to select data out (or write data to) the corresponding sense amplifier. However, because there is only one shared data path, no more than one bank may store data from the associated system write data lines or drive data on the system read data lines.

As a result, testing of the conventional multibank memory device must be performed one bank at a time. While this approach will eventually result in testing of the memory banks, the time to perform such sequential bank-by-bank testing is excessive and, therefore, prohibitive.

SUMMARY OF THE INVENTION

In one aspect of the invention, a method of testing a multibank memory device having a plurality of memory banks comprises the steps of: (a) activating two or more of the plurality of memory banks for participation in the test; (b) selecting at least one common memory address corresponding to a memory cell within each activated bank; (c) simultaneously writing test data into the selected memory cell of each activated bank; (d) simultaneously reading the test data previously written into the selected memory cell of each activated bank; and (e) comparing the test data read from each activated bank with the test data read from each other activated bank and if a match is determined to exist, then indicating a pass condition, else indicating a fail condition.

In another aspect of the invention, a method of selectively accessing memory banks of a multibank memory device having a common internal data path operatively coupled to the plurality of memory banks comprises the steps of: (a) providing an internal bank activation signal, the internal bank activation signal indicating which memory banks of the plurality of memory banks have been activated; (b) permitting one of sequential internal reading and sequential internal writing of data from/to the activated memory banks via the common internal data path; and (c) denying one of sequential internal reading and sequential internal writing of data from/to non-activated memory banks via the common internal data path.

Advantageously, the present invention provides a multibank DRAM device test mode which substantially reduces the overall test time associated with testing all banks of the multibank DRAM device and a bank interlock scheme which provides a data path locking feature with respect to the banks during test mode and normal operation mode.

These and other objects, features and advantages of the present invention will become apparent from the following detailed description of illustrative embodiments thereof, which is to be read in connection with the accompanying drawings.

BRIEF DESCRIPTION OF THE DRAWINGS

FIG. 2 is an exemplary logic truth table for a data path bank select logic arrangement according to the invention; and FIG. 3 is an exemplary logic truth table for pass/fail logic and an off chip driver block according to the invention.

DETAILED DESCRIPTION OF THE INVENTION

Figure 1:
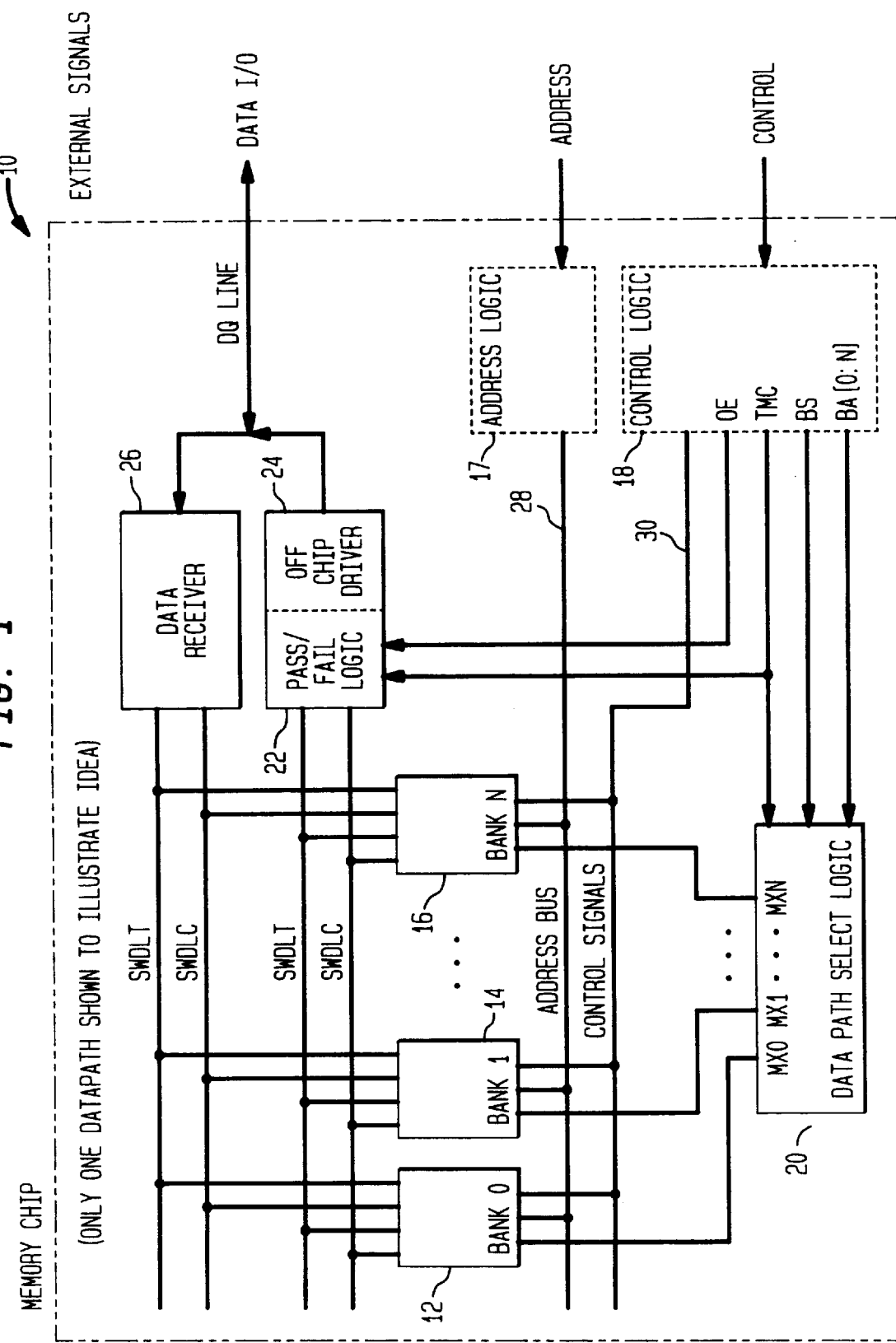
FIG. 1 is a block diagram illustrating a multibank DRAM device implementing a bank interlock scheme and test mode according to the invention.

Referring initially to FIG. 1, an implementation of the invention is shown in the context of relevant portions of a multibank memory device 10. Such memory devices include, for example, a random access memory (RAM), a dynamic random access memory (DRAM), a synchronous DRAM (SDRAM), a read only memory (ROM) or a merged DRAM-logic circuit (embedded DRAM). In one embodiment, the memory device comprises a DRAM. It is to be understood that, for the sake of clarity, only a one-bit data path is illustrated; however, implementation of the invention may obviously be extended to more practical data bus configurations having a greater number of parallel data bits, e.g., 8, 16, 32, 64 bit databuses, or greater.

As shown, a multibank DRAM device 10 comprises N banks. The multibank DRAM device may preferably be a multibank SDRAM device, although other types of multibank DRAM devices may implement the teachings of the invention. Each bank; bank 0 (block 12), bank 1 (block 14) through bank N (block 16), is operatively coupled to data path bank select logic 20 via respective select signal bank lines MX0, MX1 through MXN. Further, each bank is operatively coupled to both the system read data lines, SRDLT (system read data line true) and SRDLC (system read data line complement) which are also operatively coupled to test mode pass/fail logic 22, which will be explained and which itself is operatively coupled to off chip driver (OCD) 24. Similarly, each bank is operatively coupled to both of the system write data lines, SWDLT (system write data line true) and SWDLC (system write data line complement) which are themselves operatively coupled to a data receiver 26. External data input/output lines (DQ lines) are operatively coupled to the OCD 24 and the data receiver 26. In addition, each bank is operatively coupled to an address bus 28 and a control signal bus 30, as is known. Address signals on bus 28 may be generated in a conventional manner via address logic 17, while control signals (e.g., read/write commands) may be generated in a conventional manner via control logic 18. Address signals and control signals are respectively externally provided to address logic 17 and control logic 18 from off-chip DRAM controller circuitry.

In response to external control signals (e.g., DRAM controller, not shown), the control logic 18 generates bank activation (BA[0:N]) signals, a bank select (BS) signal, and a compression test mode (TMC) signal. These three signals are applied to data path bank select logic 20. In addition, the pass/fail logic 22 receives both the TMC signal as well as an output enable (OE) signal, also generated by control logic 18. One of ordinary skill in the art will be able to implement such logic control circuitry (control logic 18) given the teachings of the invention described herein and, thus, a further description is not provided.

Although illustrated as separate data lines, SRDLT and SWDLT may be one bidirectional data line. Likewise, SRDLC and SWDLC may be another bidirectional data line. Further, it is not critical to the invention that a true/complement data line arrangement be employed. Rather, a single read data line and a single write data line arrangement with a data valid signal may be employed.

Generally, the present invention provides a unique test mode which significantly reduces the time associated with testing the banks of the multibank DRAM device. In accordance with the invention, as will be explained by way of a detailed example, the test mode tests all activated banks for memory cell fails simultaneously by parallel writing and reading of data bits. As a result, a write command is equivalent to N sequential write commands, respectively, to N different banks, and a read command provides pass/fail information as a compressed result of reading all N banks. For instance, if the test pattern is the same for each bank, then the row address during activation of each bank is the same. In such a case, if data read out of all banks is the same as the data written therein, then the result of the test is "pass". If the data is not identical, then a "fail" is detected and the device may be replaced or, if in prefuse testing (as will be explained), the failed portion of memory may be repaired or replaced with redundant portion.

While the test mode of the invention may utilize an identical local test pattern in each bank and, as a result, the row address for each bank during activation is equal, the test mode is also capable of compressing non-corresponding word lines. Significantly, as data that is compressed comes from far apart regions of the chip, the probability that a multi-bit error will result in a wrong test result is substantially minimized. This will be further explained later in the description.

Referring now to FIG. 2, an exemplary implementation of the unique test mode and locking function of the invention is illustrated with respect to the signals input to (BS, BA, TMC) and output from (MX) the data path bank select logic 20 of the device 10 (FIG. 1). Please note that column (C) and row (R) numbers have been inserted into the table in order to facilitate reference between the table and this description. Column 1 represents the test mode signal (TMC) which enables and disables the test mode of the invention. Thus, by adopting a logic 0 as a disable condition and a logic 1 as an enable condition, it may be seen that rows 1–6 (TMC=0) represent normal operation (non-test mode or test mode not enabled) of the device 10, while row 7 (TMC=1) represents operation of the device in test mode. Of course, it is to be appreciated that an alternative logic designation could be employed, i.e., logic 0 enabling a function and logic 1 disabling the function. Such designation is not particularly critical to the invention.

Further, columns 2–5 represent individual bits of the bank select (BS) signal. While two bits are shown between the most significant bit (column 2) and the least significant bit (column 5), the BS signal may have more or less bits depending on the number of banks to be selected. Still further, columns 6–9 represent the individual bank activation (BA) signals with column 6 representing activation of bank 0 (BA0 signal), column 7 representing activation of bank 1 (BA1 signal), through column 9 which represents activation of bank N (BAN signal). Column 8 merely represents all the possible banks activated between bank 1 and bank N. Likewise, columns 10–13 represent the individual select bank (MX) signals in a similar manner as is shown for the BA signals.

Examples of normal operation (non-test mode) will now be explained. Row 1 illustrates selection and activation of bank 0. The bits of the BS signal are all logic 0's indicating the bank 0 is being selected by the external control circuitry (DRAM controller). Next, the BA0 signal (column 6) is set to a logic 1 thus indicating that bank 0 is activated. The remainder of the BA signals are "don't cares" (X) because it doesn't matter at this point whether the other banks are activated because, due to the condition of the BS signal, only bank 0 is selected. Accordingly, the MX0 signal (column 10) is also set to 1 thus internally selecting bank 0, as shown in FIG. 1. All other MX signals are logic 0 so as not to internally select such unselected (i.e., not addressed via BS signal) banks. Thus, row 1 illustrates a bank 0 read or write data access. The determination as to whether the operation is a read or write operation is determined by the external DRAM controller, in a conventional manner.

Next, row 2 illustrates the attempted selection of bank 0 by the BS signal; however, because the BA0 signal is not activated and as a result the BA0 signal is a logic 0, the MX0 signal is not set and thus bank 0 is not internally selected. Thus, if a bank is not activated by the proper BA signal being set, then the bank is never selected regardless of the condition of the BS signal.

Rows 3 and 4 respectively illustrate the same conditions as shown in rows 1 and 2, but for bank 1. That is, row 3 is a bank 1 read or write data access and row 4 illustrates bank 1 not being able to perform a read/write operation. Similarly, rows 5 and 6 show the same for bank N.

Thus, it is to be appreciated that the manipulation of the BA signals may be employed to provide a unique interlocking feature in accordance with the invention. As shown and explained above with respect to rows 2, 4 and 6, even if the bank select signal (BS) is set to a 1 in order to select the respective bank, the bank will not actually be internally selected by the proper select bank (MX) signal unless the proper bank activation (BA) signal is set. Therefore, the invention provides the ability to lock and unlock a bank and/or sets of banks within the multibank DRAM device. That is, if certain banks are not activated, then they do not have access to the internal data lines of the device and therefore do not perform read/write operations. This unique bank interlock scheme may be employed in normal operation, as explained above, or in the test mode, as will be explained below.

Referring to row 7 of the table in FIG. 2, it is shown that the test mode (TMC) signal is set to a logic 1, thereby enabling the test mode of the invention. As a result, the condition of the bank select (BS) signal applied to the device does not matter (don't care). However, the bank activation (BA) signals determine which banks are included in the test. Columns 6–9 indicate that banks 0 through N are activated; however, fewer banks (down to one bank) may be activated in the test mode. The MX signals are set to correspond to the BA signals. As shown in the table, MX0 through MXN are set thereby internally selecting banks 0 through bank N. The nomenclature used in columns 6–12 (BA0, BA1 . . . BAN) is employed to highlight the correspondence between the BA signals and the MX signals; however, in accordance with the logic designation adopted herein, each signal may be represented as a logic 1 to indicate that the signal is enabled. Of course, as mentioned before, a logic 0 could be used to indicate an enable condition and a logic 1, a disable condition.

Accordingly, with the test mode enabled and with the desired banks activated (by the BA signals) and selected (by the MX signals), a single write (or write burst) command may be issued (again, via the external DRAM controller) and a test pattern is then parallel written into the memory cells (e.g., one memory cell per bank unless a write burst command is issued in which case more than one cell per bank is written to) of each bank (using the address bus 28 to provide the column addresses) which is activated. As mentioned, the single write command is tantamount to N sequential write commands to N different banks, N being the number of activated banks. Again, the BA signals may serve to lock access to/from the data lines for banks which are not chosen to be tested at this time. After the test pattern data is written into the activated banks, a read command is applied and pass or fail information is then acquired as a compressed result of reading, in parallel, and comparing the data from all N banks.

It should be understood that the exact test pattern used in the test mode is not critical to the invention and one skilled in the art will be able to implement an acceptable approach for determining a pass/fail condition depending on the test pattern employed. However, referring now to FIG. 3, a truth table illustrating an example of possible results associated with implementing pass/fail logic 22 (FIG. 1) in conjunction with the off chip driver 24 (FIG. 1) is shown. As the exact implementation of pass/fail logic may depend on the types of data lines employed, its implementation is not critical to the invention and, as a result, the table of FIG. 3 merely represents one example of processing results from the unique parallel writing/reading operation provided by the bank interlock scheme and test mode of the invention.

Again, column and row numbers are provided to facilitate correspondence between the table and this description. Columns 1–4 represent examples of the logic conditions of the system read data lines true/complement (SRDLT and SRDLC), the output enable (OE) signal and the device external input/output data (DQ) line when the test mode is disabled (TMC=0). Columns 5–8 represent an example of the same when the test mode is enabled (TMC=1).

Therefore, referring first to columns 1–4, it is seen that in normal operation (non-test mode), SRDLT and SRDLC carry the data to the off chip driver 24. So, as shown in column 1, when SRDLT is a logic 0, the complementary line SRDLC is a logic 1. Then as is known, if the OE signal is set, then the output data bit on the DQ line is a logic 0. Alternately, when SRDLT is a logic 1, SRDLC is a logic 0 and, assuming the OE signal is set, then the DQ line is a logic 1.

In column 3, both SRDLT and SRDLC are precharged to logic 1 and, as a result, the DQ line is at a high impedance (HiZ) condition and no data is externally output from the off chip driver. Column 4 illustrates a condition which is not valid or, more accurately, is not possible in the device if it is operating correctly in the normal mode. That is, both SRDLT and SRDLC are a logic 0. This condition would require that both SRDLT and SRDLC be discharged at the same time, which cannot happen because in normal mode only one bank is selected at a time and the other banks are not activated. Thus, DQ in column 4 is denoted as being invalid/not possible. Of course, if opposite logic polarity were employed, then the condition of SRDLT and SRDLC being logic 1's would be invalid/not possible while the condition of SRDLT and SRDLC being logic 0's would denote a HiZ output.

As mentioned previously, the use of true/complement data lines to illustrate the invention is an arbitrary choice. The known advantage of true/complement data lines is that when both lines are precharged to a logic 1 and then one or both of the precharged lines is/are pulled to a logic 0 by a memory cell, then you know that you have valid data that may be output on DQ lines. With a single data signal, a data valid signal must be provided to indicate when valid data is actually available to be output from the device. However, either approach may be implemented with respect to the present invention.

Referring now to columns 5–8, the test mode of the invention is illustrated. It is to be understood that a predetermined test pattern is first written in parallel into the activated data banks on SWDLT and SWDLC. For instance, the bank activation signals (BA[0:N]) dictate which banks will be tested. TMC goes to a logic 1 to enter the test mode, in which case the BS signal is ignored (don't care, as shown in FIG. 2). The OE signal will be a logic 0 to indicate a write operation. Then, a column address is decoded by the address logic 17 and provided on address bus 28 (row address is also previously supplied therefrom) and a write command is decoded by the control logic 18 and provided on control signal bus 30. If a logic 1 will first be written into the same column address for each bank, then SWDLT will be a logic 1 (SWDLC will be a logic 0) and thus a logic 1 is written in parallel into each memory cell of each bank corresponding to that column address. Then, the column address is changed or incremented and the next data value on SWDLT (logic 0 or another logic 1) is written in parallel into each memory cell in each bank corresponding to that next column address. Thus, the entire test pattern may be written into the banks in this manner.

Now, when reading the data from the activated banks, a read command is decoded by the control logic 18 and provided on the control signal bus 30 and the OE signal goes to a logic 1. Then, the data bit in each memory cell in each bank corresponding to the decoded column address is read out in parallel and provided to the pass/fail logic 22 (FIG. 1). If all the memory cells have the same data (logic 1 or logic 0), i.e., a match, then a test pass condition is achieved; however, if at least one of the banks does not output the same value, then a test fail condition is indicated.

The table of FIG. 3 illustrates this concept. Column 5 indicates that SRDLT is driving a logic 0 and SRDLC remains at a logic 1. This indicates that all memory cells corresponding to the respective column address are storing a logic 0. Assuming this was the value written into such cells during the write operation, then a pass condition exists for that portion of the test. This is shown as a logic 0 being output on the DQ line. On the other hand, column 6 indicates that SRDLC is driving a logic 0 and SRDLT remains at a logic 1. This means that all the memory cells corresponding to the next respective column address are storing a logic 1. Again, assuming this was the value written into such cells during the write operation, then a pass condition also exists for this portion of the test. Similar to the situation in column 5, the result is indicated on the DQ line as a logic 0. It is to be understood that the logic level output on the DQ line, as shown in the table, is arbitrary and may be implemented in any of a variety of ways. That is, the pass/fail logic 22 could be formed such that a logic 1 is output on the DQ line to indicate a pass condition, rather than a logic 0 as shown in the table. Also, the actual data value on the read data lines may be output on the DQ line as an indication of a pass or fail condition, e.g., DQ in column 5 would therefore be logic 0 and in column 6 would be logic 1.

Column 7 shows the situation where neither SRDLT nor SRDLC are driving data, that is, either no data is available or no bank has been activated and, in accordance with the locking feature of the invention, no bank has access to the data path. Thus, both SRDLT and SRDLC remain a logic 1 in which case the DQ line is in the high impedance (HiZ) state. Referring now to column 8, both SRDLT and SRDLC are logic 0. Such a condition would exist if, for example, the data value written into the memory cells, with the column address of interest, was a logic 0. Normally, if this were the case, SRDLT would be a logic 0 (as it is); however, SRDLC would be a logic 1. The only way that SRDLC could also be a logic 0 is if at least one of the subject memory cells which had a logic 0 written therein now indicated a logic 1, now causing SRDLC to be a logic 0. This would indicate a fault or problem with such memory cell since a logic 0 was originally written thereto but now a logic 1 is being read therefrom. Thus, in accordance with the logic level outputs for the pass/fail condition shown in row 5 of the table, a logic 1 is output on the DQ line to indicate a fail condition. Again, other logic or data line conditions may be used to indicate a test fail condition, e.g., forcing the DQ line to a HiZ state.

Lastly, column 9 of the table illustrates what occurs when a write command is issued and the test mode is not applicable. The OE signal goes to a logic 0 and, as a result, you are no longer reading test results and thus SRDLT and SRDLC are don't cares (X).

It is to be understood that the inventive test mode may be run to provide a simple pass/fail result indicating that one of the banks of the entire array has a failure. This would be useful for generally testing memory devices where a test pattern is written into the entire array (or portions thereof), the memory device is left in a powered-up state for some time, and then the stored test pattern is read out and compared to the previously written data pattern. Also, instead of letting the memory device sit idly, the device may be disturbed by introducing conductive and/or radiated noise into the chip and then the data is read out and compared to see if there is any negative effect on the data caused by the noise. In the case of prefuse testing, a single read cycle to yield a simple pass/fail indication may not be sufficient to isolate the source of a failure, in which case, N more read cycles (N+1) up to the number of fixable fails may be needed to discriminate which bank or banks is/are failing. Therefore, once the failed bank or banks is/are isolated, the effected word line or bit line may be replaced with a redundant word line or bit line, respectively.

Furthermore, as previously mentioned, the test mode of the invention permits compressing of non-corresponding word lines. That is, corresponding word lines of each bank do not have to be read (or written to for that matter). Thus, for example, the first word line may be read out from the first activated bank, together with the fifteenth word line from the second activated bank, together with the thirtieth word line from the third activated bank, etc. Given this ability, if the data that is compressed comes from non-corresponding word lines of the device which are located on far apart areas of the chip, then the probability is minimized that a multi-bit error will result in a wrong test result. In other words, depending on the test pattern, the chances that a multi-bit error would be misconstrued as a pass condition are substantially reduced.

The present invention compression test mode should be contrasted with known compression test operation where several data bits from one word line in one bank may be compressed in the test mode in order to help reduce the number of sequential column access commands necessary on one word line. In such a case, the test patterns to be used are restricted, as the location and distance of logic 1's and logic 0's must fit the compression scheme.

Furthermore, during the test mode described herein, the bank select (BS) signal of any write or read command is masked and every activated bank and its data path may be internally selected. Therefore, the number of banks participating in the test mode can be varied at any time by the user using bank activate and precharge commands. As mentioned, non-activated banks can neither store data nor provide data and therefore their data path is not selected.

It is to be appreciated that conventional memory device circuitry (such as address decoders, etc.) may be part of address logic 17 and control logic 18 or not shown for the sake of simplicity. Also, although not mentioned explicitly, all conventional control signals not shown (such as a data path clock) may be provided over the control signal bus. One of ordinary skill in the art will appreciate that such conventional components and signals may be provided in known manners.

Although illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention.

What is claimed is:

1. A method of testing a multibank memory chip having a plurality of memory banks, the method comprising the steps of:

activating two or more of the plurality of memory banks on the chip for participation in the test;

selecting at least one memory address corresponding to a memory cell within each activated bank;

simultaneously writing test data into the selected memory cell of each activated bank;

simultaneously reading the test data previously written into the selected memory cell of each activated bank; and comparing the test data read from each activated bank with the test data read from each other activated bank and if a match is determined to exist, then indicating a pass condition, else indicating a fail condition.

2. A method of selectively accessing memory banks of a multibank memory chip having a common internal data path operatively coupled to the plurality of memory banks, the method comprising the steps of:

providing a bank activation signal, the bank activation signal indicating which memory banks of the plurality of memory banks are activated;

permitting, in accordance with said bank activation signal, one of internal reading and internal writing of data from/to the activated memory banks via the common internal data path while preventing one of internal reading and internal writing of data from/to non-activated ones of said memory banks via the common internal data path.

3. Apparatus for testing a multibank memory chip having a plurality of memory banks, the apparatus comprising:

means for activating two or more of the plurality of memory banks on the chip for participation in the test;

means for selecting at least one memory address corresponding to a memory cell within each activated bank;

means for simultaneously writing test data into the selected memory cell of each activated bank;

means for simultaneously reading the test data previously written into the selected memory cell of each activated bank; and means for comparing the test data read from each activated bank with the test data read from each other activated bank and if a match is determined to exist, then indicating a pass condition, else indicating a fail condition.

4. The apparatus of claim 3, wherein the activating means includes a data path bank select logic unit which is responsive to a bank activation signal and which generates a plurality of select bank signals respectively corresponding to the plurality of memory banks, the select bank signals selectively activating the memory banks in response to the bank activation signal.

5. The apparatus of claim 3, wherein the comparing means includes a pass/fail logic unit which is responsive to a test mode signal and internal data lines and which generates a test result signal indicative of the pass/fail condition.

6. Apparatus for selectively accessing memory banks of a multibank memory chip having a common internal data path operatively coupled to the plurality of memory banks, the apparatus comprising:

means for providing a bank activation signal, the bank activation signal indicating which memory banks of the plurality of memory banks of the chip are activated;

means for permitting, in accordance with the bank activation signal, one of internal reading and internal writing of data from/to the activated memory banks via the common internal data path while preventing one of internal reading and internal writing of data from/to non-activated ones of said memory banks via the common internal data path.

7. A method of testing a multibank memory chip having a plurality of memory banks, the method comprising the steps of:

activating two or more of the plurality of memory banks on the chip for participation in the test;

selecting at least one memory address corresponding to a memory cell within the activated banks;

writing test data into the selected memory cell of the activated banks in parallel;

reading the test data previously written into the selected memory cell of the activated banks in parallel; and comparing the test data read from the activated banks with the test data read from the other activated banks and if a match is determined to exist, then indicating a pass condition, else indicating a fail condition.

8. The method of claim 1 wherein a first selected memory address within a first activated bank is different from a second selected memory address within a second activated bank, with test data from memory cells located at said first and second memory addresses being compared in said comparing step.

9. The method of claim 1 wherein the step of activating two or more of the plurality of memory banks comprises activating only a selected portion of the plurality of memory banks for participation in the test at a given time.

10. The method of claim 1 wherein said memory chip comprises a dynamic random access memory (DRAM).

11. The apparatus of claim 3 wherein a first selected memory address within a first activated bank is different from a second selected memory address within a second activated bank, with test data from memory cells located at said first and second memory addresses being compared in said comparing step.

12. The apparatus of claim 3 wherein the step of activating two or more of the plurality of memory banks comprises activating only a selected portion of the plurality of memory banks for participation in the test at a given time.

13. The apparatus of claim 3 wherein said memory chip comprises a dynamic random access memory (DRAM).

14. The method of claim 2, further comprising providing, during a normal operating mode, a bank select signal that indicates which one of said plurality of memory banks is to be selected for one of sequential writing and sequential reading operations during the normal operating mode; and wherein said bank activation signal is applied during a test mode and overrides said bank select signal.

15. The apparatus of claim 6, further comprising means for providing, during a normal operating mode, a bank select signal that indicates which one of said plurality of memory banks is to be selected for one of sequential writing and sequential reading operations during the normal operating mode; and wherein said bank activation signal is applied during a test mode and overrides said bank select signal.

* * * * *